United States Patent [19]
Paul

[11] Patent Number: 5,736,757
[45] Date of Patent: Apr. 7, 1998

[54] CHARGE-DOMAIN GENERATION AND REPLICATION DEVICES

[75] Inventor: Susanne A. Paul, Lexington, Mass.

[73] Assignee: Massachusetts Institute of Technology, Cambridge, Mass.

[21] Appl. No.: 580,427

[22] Filed: Dec. 27, 1995

Related U.S. Application Data

[63] Continuation-in-part of Ser. No. 271,520, Jul. 7, 1994, Pat. No. 5,579,007.

[51] Int. Cl.⁶ .................... H01L 27/148; H01L 29/768
[52] U.S. Cl. .................... 257/236; 257/237; 257/239; 257/296; 257/315; 257/316; 257/319; 257/365; 257/366
[58] Field of Search .................... 257/236, 237, 257/239, 296, 315, 316, 319, 365, 366

[56] References Cited

U.S. PATENT DOCUMENTS

| | | |
|---|---|---|
| 3,806,772 | 4/1974 | Early . |
| 4,047,051 | 9/1977 | Heller . |
| 4,107,550 | 8/1978 | Jacquart et al. . |
| 4,171,521 | 10/1979 | Wang et al. . |
| 4,206,446 | 6/1980 | Rockett, Jr. . |
| 4,326,192 | 4/1982 | Merrill et al. . |
| 4,329,679 | 5/1982 | Jensen . |
| 4,375,059 | 2/1983 | Schlig . |
| 4,471,341 | 9/1984 | Sauer . |
| 4,489,309 | 12/1984 | Schlig . |
| 4,625,293 | 11/1986 | Vogelsong et al. . |
| 4,768,211 | 8/1988 | Aroues ........................ 377/60 |
| 5,014,059 | 5/1991 | Seckora . |
| 5,030,953 | 7/1991 | Chiang . |
| 5,061,927 | 10/1991 | Linnenbrink et al. . |
| 5,189,423 | 2/1993 | Linnenbrink et al. . |
| 5,327,138 | 7/1994 | Linnenbrink et al. . |
| 5,343,297 | 8/1994 | Tiemann et al. . |
| 5,436,476 | 7/1995 | Hynecek ........................ 257/223 |
| 5,495,116 | 2/1996 | Funakoshi et al. ............ 257/239 |
| 5,546,438 | 8/1996 | Hynecek ........................ 377/60 |

FOREIGN PATENT DOCUMENTS

| | | |
|---|---|---|
| 0 068 143 | 1/1983 | European Pat. Off. . |
| 0559155 A1 | 9/1993 | European Pat. Off. . |
| 55-138276 | 10/1980 | Japan . |

*Primary Examiner*—Ngân V. Ngô
*Attorney, Agent, or Firm*—Samuels, Gauthier, Stevens & Reppert

[57] ABSTRACT

A charge generation device configured within a semiconductor region of a substrate. The device includes a source for providing an input charge and an input diffusion which receives said input charge. A barrier gate associated with the input diffusion determines a selected potential of the input diffusion. A preset diffusion presets the input diffusion to the selected potential. An output element receives the input charge from the input diffusion. A first coupling means is provided for coupling the preset diffusion to the input diffusion subsequent to the output diffusion receiving the input charge during a first clock cycle, and for decoupling the preset diffusion from the input diffusion prior to the input diffusion receiving the input charge during a second clock cycle. A second coupling means is provided for coupling the output element to the input diffusion, subsequent to the decoupling of the preset diffusion from the input diffusion during the second clock cycle, and for decoupling the output element from the input diffusion prior to the coupling of the preset diffusion to the input diffusion during a third clock cycle.

18 Claims, 15 Drawing Sheets

$$(1) \quad sm_m = sm_0 + gc_0 \times \sum_{i=1}^{m} d_i 2^{-i}$$

$$(2) \quad gc_m = gc_0 \times 2^{-m} = gc_0 \times \sum_{i=m+1}^{\infty} 2^{-i}$$

$$(3) \quad sp_m = sp_0 + gc_0 \times \sum_{i=1}^{m} \overline{d}_i 2^{-i}$$

$$(4) \quad d_i = 1 \text{ if } s_i > r_i$$

$$(5) \quad sp_0 - sm_0 \approx gc_0 \times \left[ \sum_{i=1}^{N} d_i 2^{-i} - \sum_{i=1}^{N} \overline{d}_i 2^{-i} \right]$$

$$(6) \quad \sum_{i=1}^{N} d_i 2^{-i} + \sum_{i=1}^{N} \overline{d}_i 2^{-i} = 1 - 2^{-N}$$

$$(7) \quad sp_0 - sm_0 \approx gc_0 \times \left[ \sum_{i=1}^{N} d_i 2^{(1-i)} - 1 \right]$$

FIG. 1B

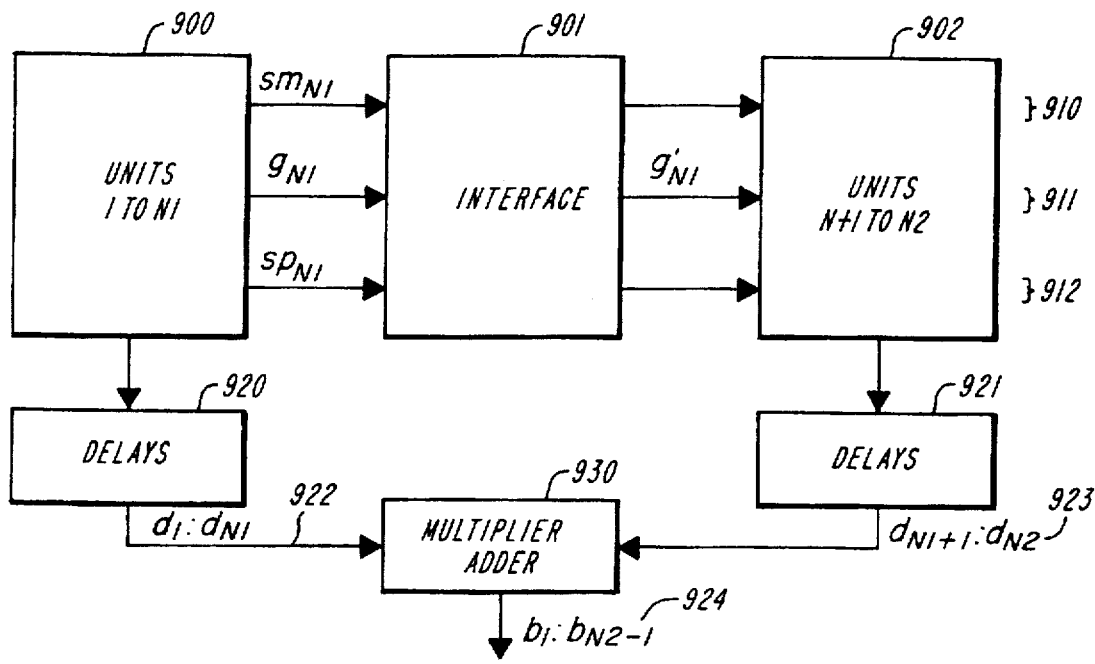
FIG. 5A
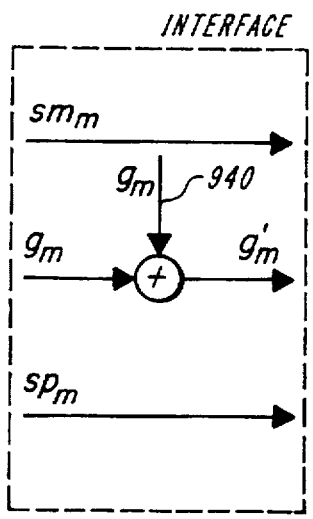
FIG. 5B
$$\begin{array}{r}d_1 \quad d_2 \ldots d_{N1}\\ +\qquad\qquad d_{N1+1}\ldots d_{N2}\\ \hline b_1 \quad b_2 \ldots b_{N1} \ldots b_{N2-1}\end{array}$$
FIG. 5C

CHARGE-DOMAIN GENERATION AND REPLICATION DEVICES

This is a continuation-in-part of application Ser. No. 08/271,520 filed on Jul. 7, 1994, now U.S. Pat. No. 5,579,007.

BACKGROUND OF THE INVENTION

The invention relates generally to charge-coupled devices (CCDs) or switched-capacitor circuits for charge-domain processing, and more particularly to charge-domain generation and replication devices.

The signals of interest in either CCD or switched-capacitor circuits are generally charge quantities. These circuits often require a charge packet to be accurately produced from a known input voltage, current, or charge. The resulting charge packet may then be subjected to further processing without altering the original input. When the input signal is a voltage or a current, a circuit for performing this function is referred to as a charge generator. Various techniques, such as fill-and-spill and diode cutoff, are well known in the field for implementing charge generators for voltage-domain input signals. When the input signal is a charge quantity, a circuit for performing this function is referred to as a charge replicator. Various techniques, utilizing a floating gate amplifier configuration, are known in the field for performing nondestructive charge replication.

Prior art techniques, such as fill-and-spill or diode-cutoff, for implementing charge generation have the primary disadvantages of a highly nonlinear voltage-to-charge translation and poor matching between different generation devices. Nonlinearity is introduced because the generated charge packets are proportional to the nonlinear capacitance of their associated CCD storage wells. Mismatches between different generators are caused by variations in the exact size of each storage well, as well as by nonuniformity in the thresholds of their component gates.

Prior art techniques for implementing charge replication have the primary disadvantages of a highly nonlinear voltage-to-charge translation, poor matching between different replication devices, and extreme sensitivity to bias conditions. These disadvantages are introduced because the signal undergoes translations between the charge and voltage domains. Although the input to these circuits is fundamentally a charge quantity, the signal is received by elements, such as an MOS gate, that convert it to, and interpret it as, a voltage. In generating the output packet, signals are then subjected to a second translation from voltage back to charge.

Nonlinearity is introduced because the replicated charge packets depend on both the nonlinear capacitance of a CCD floating gate and on the nonlinear capacitance of a receiving storage well. Absolute device parameters, such as capacitance, determine the transfer characteristic from one domain to another and must be precisely controlled. Mismatches between different replicators are caused by variations in the capacitances and threshold voltages of the components of each.

An extreme sensitivity to bias conditions is caused by translations of the signals between the voltage and charge domains. As a result of these translations, there is no well defined zero level and a measure of the output's zero level must be established by an external reference. When multiple translations are cascaded, the cumulative effect of offsets in the zero level, inexact biases, or threshold variations, introduced at each stage, can lead to an unstable operating point and introduce saturation.

Prior art replication techniques also have the disadvantages of requiring large clock voltage swings and of providing limited charge handling capacity. The floating gate's precharge voltage must be compatible with the levels of adjacent CCD gates and must lie midway between the high and low levels of the clocks immediately preceding and following it. In comparison with a configuration in which all gates are clocked, this approximately doubles the necessary clock swings. As the floating gate voltage falls from its original precharge value in response to an underlying charge packet, there is a reduction in its charge handling capacity.

Accordingly, it is an object of the present invention to provide charge generation and replication techniques with improved accuracy, matching, and linearity by eliminating a dependence of the transfer characteristic on absolute device parameters, such as threshold voltages and gate areas, or on nonlinear device characteristics, such as CCD well capacitances.

It is another object of the present invention to provide charge sensing and replication techniques with improved linearity and reduced sensitivity to bias conditions by utilizing entirely charge-domain operations, without intermediate charge-to-voltage conversions.

It is a further object of the present invention to provide charge sensing and replication techniques with reduced clock voltage swing requirements and improved storage capacity by preventing a fall in the floating gate voltage as a result of charge sensing and by applying a clocked waveform to the floating gate.

It is yet another object of the present invention to provide charge sensing and replication techniques that may be used to perform charge comparisons with improved resolution, increased speed, and reduced power by incorporating differential amplification and common-mode rejection into the charge sensing process and performing these operations in the charge-domain.

SUMMARY OF THE INVENTION

The present invention provides a charge generation device configured within a semiconductor region of a substrate. The device includes a source for providing an input charge and an input diffusion which receives said input charge. A barrier gate associated with the input diffusion determines a selected potential of the input diffusion. A preset diffusion presets the input diffusion to the selected potential. An output element receives the input charge from the input diffusion. A first coupling means is provided for coupling the preset diffusion to the input diffusion subsequent to the output diffusion receiving the input charge during a first clock cycle, and for decoupling the preset diffusion from the input diffusion prior to the input diffusion receiving the input charge during a second clock cycle. A second coupling means is provided for coupling the output element to the input diffusion, subsequent to the decoupling of the preset diffusion from the input diffusion during the second clock cycle, and for decoupling the output element from the input diffusion prior to the coupling of the preset diffusion to the input diffusion during a third clock cycle.

The circuits in accordance with the present invention include an input diffusion, a cascode barrier gate that determines the potential of the input diffusion, a signal source which provides a controlled amount of charge to the input diffusion, a receiving element which receives replicated charges from the input diffusion, and a preset diffusion which replenishes the replicated charges. The circuits may be used to perform the operations of charge replication, whereby a charge packet is nondestructively sensed and a duplicate of it is produced, or charge generation, whereby an input voltage or current is sensed and a charge packet is produced that is representative of this input. Additional control gates may be included in either a charge replicator or charge generator circuit to modify the resulting output packet in a predetermined manner. Two complementary replicators or generators may be connected in a feedback configuration, by means of this control gate, to achieve differential amplification and common-mode rejection for purposes such as charge packet comparison.

BRIEF DESCRIPTION OF THE DRAWINGS

FIG. 1B shows the conversion algorithm which is implemented by the CCD of the present invention;

FIG. 5A shows a block diagram representation of an exemplary embodiment of the present invention which incorporates digital error correction; FIG. 5B shows an exemplary interface stage; FIG. 5C shows an error correction algorithm.

DETAILED DESCRIPTION OF THE ILLUSTRATED EMBODIMENTS

Figure 1A:
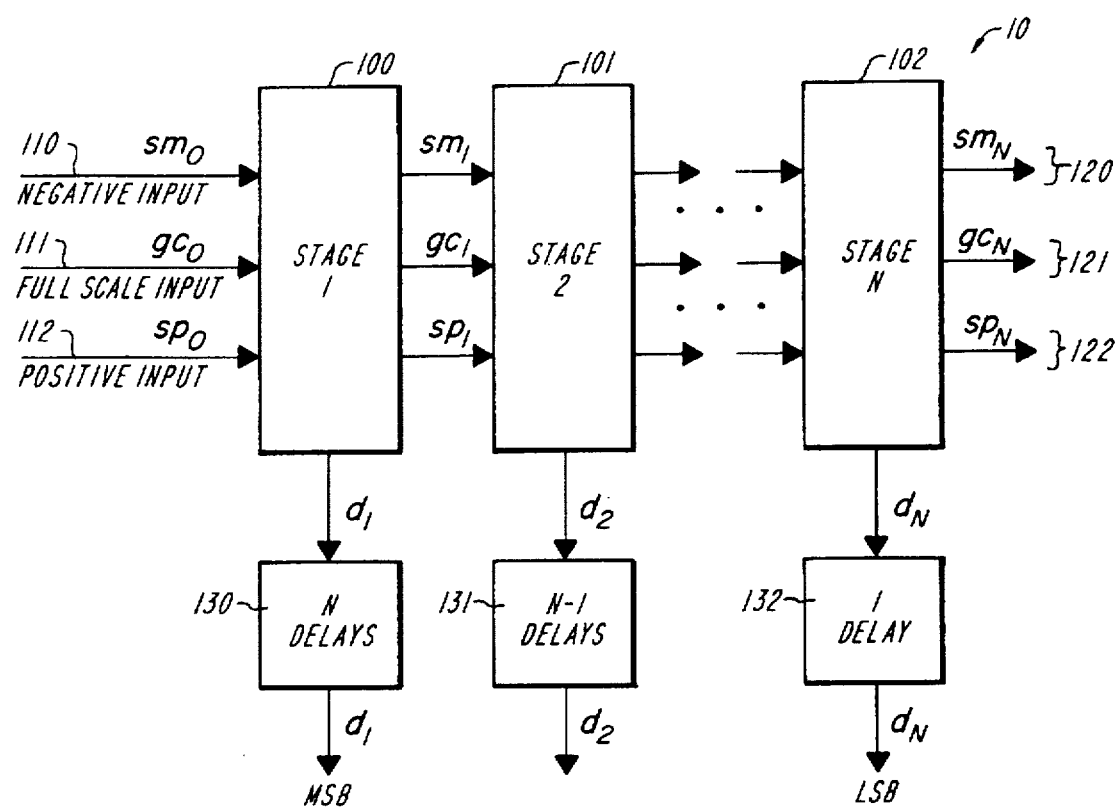
FIG. 1A shows a block diagram of a charge-to-digital converter in accordance with the present invention.

FIG. 1A shows a block diagram of a charge-to-digital converter 10 (CDC) in accordance with the present invention. The N-bit CDC contains a pipeline of N identical conversion units 100–102 through which a conversion result is determined successively, from the most significant bit (MSB) to the least significant bit (LSB) in a bit-serial manner. The pipeline consists of three charge flow channels, 120,122,121, referred to as the negative, positive, and scaling channels, respectively, with corresponding charge packets denoted $sm_m$, $sp_m$, and $gc_m$. The channels begin at the converter inputs, 110,112,111, pass through all conversion units in the pipeline, and terminate after the final unit at charge drains. Each conversion unit receives signals from the immediately preceding unit, operates on these signals, and passes them on to the following unit. Multiple inputs are processed in parallel along the pipeline so that one digital word is completed at each clock cycle. Optionally, the bits corresponding to a single input may be appropriately delayed by delay units 130–132 so that they arrive simultaneously at the converter's output.

The conversion algorithm which is implemented by the CDC of the present invention is shown in FIG. 1B. The algorithm is based on bit-serial successive-approximation A/D techniques which are well known in the technical field. A fully differential algorithm has been chosen because it can be implemented using only the operations of addition and fixed ratio division, and these operations can be easily and accurately performed using CCD technology. Equations 1–3 describe the signal flow through the negative, scaling, and positive channels, respectively, with the subscript m denoting quantities in the $m^{th}$ unit. Prior to the first conversion unit 100, the converter 10 accepts a differential input on signals $sm_0$ (110) and $sp_0$ (112) and a full-scale reference signal, $gc_0$ (111). As indicated by equation 2, the signal $gc_m$ is divided by a factor of two at each unit, and therefore decreases exponentially along the pipeline. The scaling signal in any given unit is approximately equal to the sum of the scaling signals in all the units following it. The quantities $sp_m$ and $sm_m$ are compared and a single digital bit, $d_m$ (comprising bits $d_1, d_2, \ldots d_N$), representing the sign of their difference is generated. Each conversion unit utilizes the signal $d_m$ to increase either $sp_m$ or $sm_m$, whichever is smaller, by the quantity of charge in its scaling channel output, $gc_m$.

Equations 1 and 3 describe this process using bits $d_m$ ($d_1$, $d_2$, ... $d_N$) delayed to produce a parallel word format. Provided the input differential $sp_0-sm_0$ is restricted to have a magnitude less than the full scale value $gc_0$, the difference between $sp_m$ and $sm_m$ in each unit is guaranteed to be less than the quantity $gc_m$. After a sufficient number of conversion units, the quantity $gc_m$ can be assumed to be negligible and the signals $sp_m$ and $sm_m$ may be approximated as being equal. The quantity $gc_N$, the scaling output from the last unit, will be equal to $gc_0*2^{-N}$ and is referred to as an LSB. The relation $sp_0-sm_0$ shown in equation 5 can be found by subtracting equations 1 from 3 and approximating $sp_N-sm_N$ by 0. The error introduced by this approximation will be less than an LSB. Finally, the most convenient equation for recovering the input signal, equation 7, is arrived at by substituting the result of equation 6 into equation 5 and ignoring the offset term $2^{-N}$. In this format, the digital result is composed directly from each comparator's output bit. The result is an N bit offset-binary word which approximates the number of LSB quantities spanned by the differential input. For example in a 4-bit converter, an input of $-1*gc_0$ corresponds to a digital result of 0000, an input of zero to 1000, and an input of $gc_0*(1-2^{-4})$ to 1111.

The algorithm computed by the converter of the present invention performs subranging on the signal at each stage. For example, the first stage determines whether the signal lies in the upper or lower half of the dynamic range, followed by the second stage which decides whether the signal lies in the upper or lower half of the region determined by the first stage. This same procedure occurs for each successive stage, until the signal has been located to within a subrange whose size equals a converter LSB. The operation of subranging can be described physically in terms of charge quantities. At any given stage, the scaling charge quantity, gm, corresponds to the size of its subrange and the maximum difference between the negative and positive signals is bounded by this quantity. Addition of $2^{-1}*g_m$ to the smaller of $sm_m$ and $sp_m$ shifts the differential signal by the size of the current subrange and the resulting differential signal corresponds to a residue. Correct operation requires the differential signals after the final stage to be equal to within an LSB, and this in turn requires that the modification charge in the last stage is sufficient to cancel any remaining differential. On a subrange boundary, where the differential signals are equal and the comparator's decision is arbitrary, the $2^{-1}*g_m$ quantity added to one channel is equal to the $2^{-1}*g_m$ quantity which will be added to the other channel in all later stages. In this way, their difference will be restored to zero.

Input $gc_0$ determines the converter's gain and quantization step size. A fixed-gain converter will typically have a time-invariant scaling input. Alternatively, $gc_0$ may be viewed as a third signal by which the result is divided, and it can be varied with time to achieve adaptive dynamic range adjustment, variable gain, or signal division. Inputs $sp_0$ and $sm_0$ can arrive as a differential signal pair, or one of them may be held at a constant level for single-ended operation. A single-ended configuration can also utilize the second signal input to accomplish offset subtraction.

Figure 2:
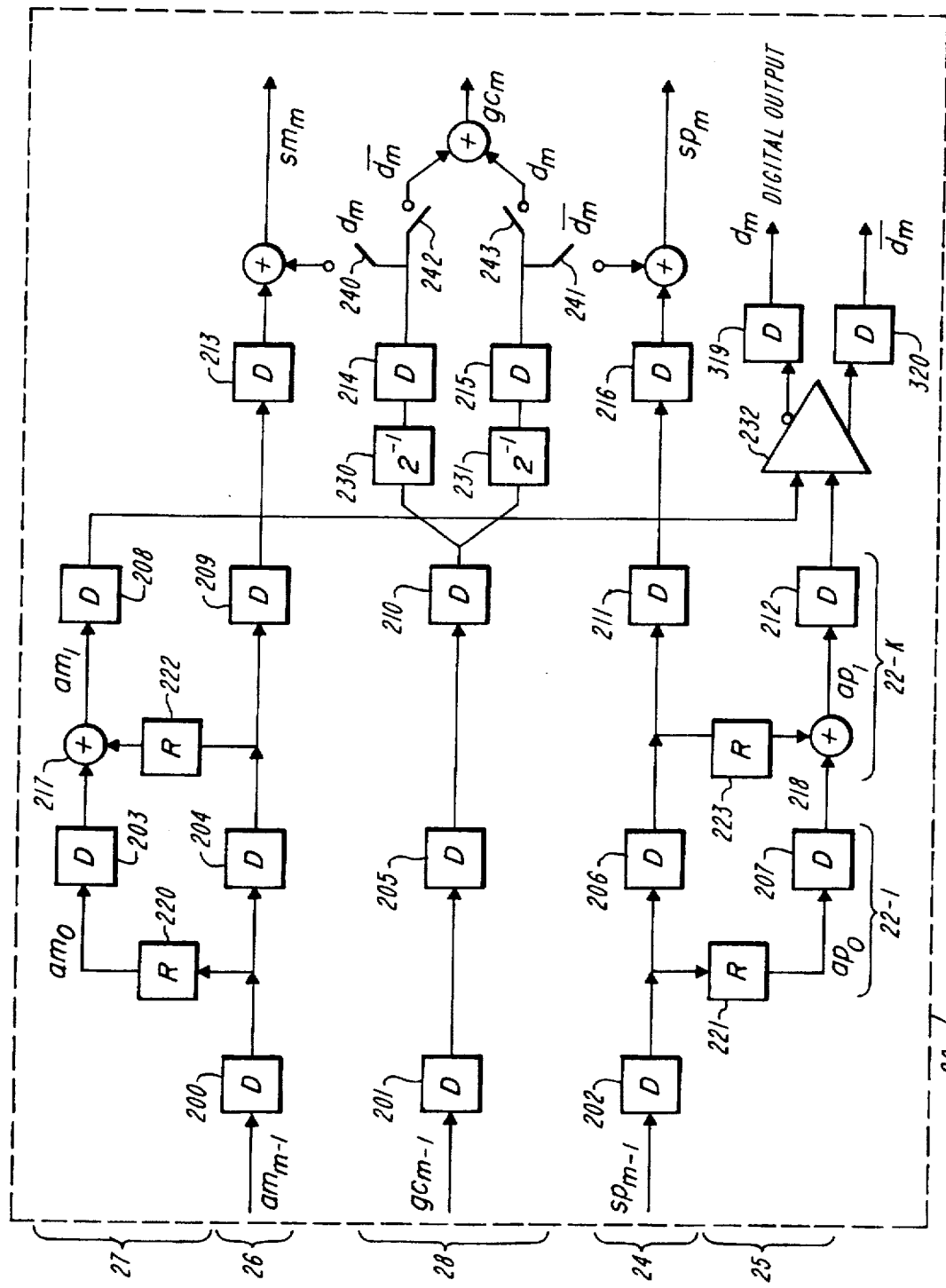
FIG. 2 shows a block diagram of a single conversion unit of a charge-to-digital converter utilizing distributed sensing in accordance with the present invention.

Various embodiments of the architecture of FIG. 1A and the algorithm of FIG. 1B differ in the details of the individual conversion units. Three exemplary embodiments are illustrated in FIGS. 2–4, and will be described hereafter in detail. Each of these figures is intended to illustrate overall structure and signal flow at a technology independent level. They do not specifically indicate the presence of individual CCD elements.

The units labelled D indicate single delay elements and physically correspond to the existence of a transfer gate which serves to block the flow of charge when in one state and to allow charge to flow forward when in the other state. The actual storage of charge occurs in a CCD storage well between two such transfer gates. The additive elements algorithmically indicate charge summation and physically correspond to a single CCD storage well which accepts input charge from two sources. The pairs of units labelled $2^{-1}$ indicate fixed ratio charge division and physically correspond to charge splitting gates such as a single CCD storage well designed to pass charge on to two equally sized receiving wells.

Operation of the device does not depend on the particular CCD clocking methodology used, and any one of the conventional two-phase, four-phase, or one-and-half phase techniques can be employed. The CCD gate configurations and timing corresponding to each of these are well known in the art of CCD design and will not be described in detail. For purposes of illustration, the following embodiments are assumed to use four-phase CCD structures. Therefore, the signal path between any two delay elements consists of four CCD electrodes and requires an entire clock cycle to traverse. The signal path is divided into various phases of operation, each of which corresponds to activity occurring over an entire clock cycle in one pipeline stage. The following descriptions trace the passage of a single input through the various phases of each conversion unit. It will be appreciated that because the device operates in a pipelined manner, other signals will follow immediately behind.

With reference now to FIG. 2, a block diagram of a single conversion unit 20 of a charge-to-digital converter utilizing distributed sensing in accordance with the present invention is shown. For illustrative purposes a 2-stage distributed sensing pipeline labeled as 22-1 through 22-K is shown. Charges in the positive 24 and negative 26 signal channels are repeatedly, nondestructively sensed and replicated in the successive stages. The replicated charges are accumulated in a positive accumulator channel 25 associated with the positive signal channel and a negative accumulator channel 27 associated with the negative signal channel. The accumulated results are passed forward in parallel with the signals being sensed so that after K stages they will contain charge packets representing K*sm and K*sp with a differential which has been amplified. The charge in the positive and negative accumulator channels is then sensed by either destructive or nondestructive techniques to form the input to the comparator, 232. The charge in the scaling channel 28 is split in half to form positive and negative modification packets 231 and 230. The outputs of the comparator, $d_m$ and $/d_m$, are used to direct one of these modification packets to its corresponding signal channel and the other to the scaling channel output. One of the comparator outputs is used to form the digital result.

The conversion unit 20 is suited to applications with a small LSB and medium dynamic range requirements. In such cases, minimum geometry CCD gates are used and the gain of a floating gate amplifier is dominated by parasitics. The size of the LSB charge quantity is sufficiently small that the voltage it would generate when sensed by floating gate devices is less than the resolution of the comparators or the input-offset error of a voltage amplifier. The charge signals must be amplified before they are converted to a voltage, and because the sensing process must occur non-destructively, this requires replicating charge packets. For these applications, the full-scale charge quantity is sufficiently small that amplification of the common-mode signal is acceptable and the positive and negative channels may be processed independently.

During the first phase of operation of unit 20, the charges $sm_{m-1}$, $sp_{m-1}$, and $gc_{m-1}$ corresponding to the outputs from the previous unit, are clocked into charge storage elements 200, 202, 201, respectively. Charge replicators 220 and 221 nondestructively sense the differential signal charges and produce output charges, $am_0$ and $ap_0$, representative of each. In the second phase of operation, charges are advanced to delay elements 204, 206, and 205 respectively. Charge replicator outputs $am_0$ and $ap_0$ are advanced to delay elements 203 and 207 which form the beginning of the positive and negative accumulator channels. Charge replicators 222 and 223 nondestructively sense the differential signal charges and produce output charges, $am_1$ and $ap_1$, which are added to the existing contents of the positive and negative accumulators 217 and 218.

During the third phase of operation, differential signal charges are advanced to delay elements 209 and 211. Charge $gc_m$ is advanced to delay element 210 and is split into two equal modification charge packets by charge splitting gates 230 and 231. Charge stored in the positive and negative accumulators is passed forward to delay elements 208 and 212, where it is destructively sensed by the input of a comparator 232. The comparator decides which accumulator had more charge, and produces two complementary digital signals, $d_m$ and $/d_m$, indicative of the result.

In the fourth phase of operation, signal charges are advanced to delay elements 213 and 216. The comparator 232 outputs. $d_m$ and $/d_m$, are latched by delay elements 319 and 320, and are driven to conditional transfer gates 240–243. If more charge was present in the negative accumulator 208 than in positive accumulator 212, $/d_m$ will be asserted and the conditional transfer gates 241 and 242 will be activated. This will cause the modification charge from delay element 215 to be added to the positive signal charge from delay element 216, and will allow the modification charge from delay element 214 to be passed forward to become the unit's scaling output, $gc_m$. If, instead, $d_m$ is asserted, the conditional transfer gates 240 and 243 will be activated. This operation will cause the modification charge from delay element 214 to be added to the negative signal charge from delay element 213 and will allow the modification charge from delay element 215 to be passed forward to become the scaling output. The outputs of the charge summers, $sm_m$ and $sp_m$, are passed forward to become the negative and positive signal outputs from the conversion unit. The digital bit $d_m$, which was latched by delay element 319, is driven to external circuitry where it is used to form the resulting output word.

In the exemplary embodiment shown in FIG. 2, the signal is nondestructively replicated twice in two consecutive stages. This process, referred to as distributed sensing, produces amplified versions of the positive and negative signal packets for input to a comparator. It improves the charge-referred comparator resolution and reduces random sensing noise or mismatches by averaging such errors over multiple stages. Any number of additional distributed sensing stages could be included to provide further amplification, provided that the amplified common-mode signal remains within the input range of the comparator. A detailed description of a preferred method of charge replication is provided in a later section. The input-output transfer characteristic of the charge replication process is not critical because these signals are only used as inputs to the comparator and are then discarded. Therefore, the process of sensing or replicating does not need to be linear. As long as it is monotonic, the sign of the accumulated difference will be preserved and the comparator will generate the correct result.

Delay elements 208–212 as shown in FIG. 2 are not essential to the operation of the embodiment and may be removed, however, this will adversely affect the speed of the device. As shown in FIG. 2., an entire phase is allocated to each charge replication and to the comparison. If these blocks are removed, charges must be replicated, added, sensed and compared in a single phase.

Figure 3A:
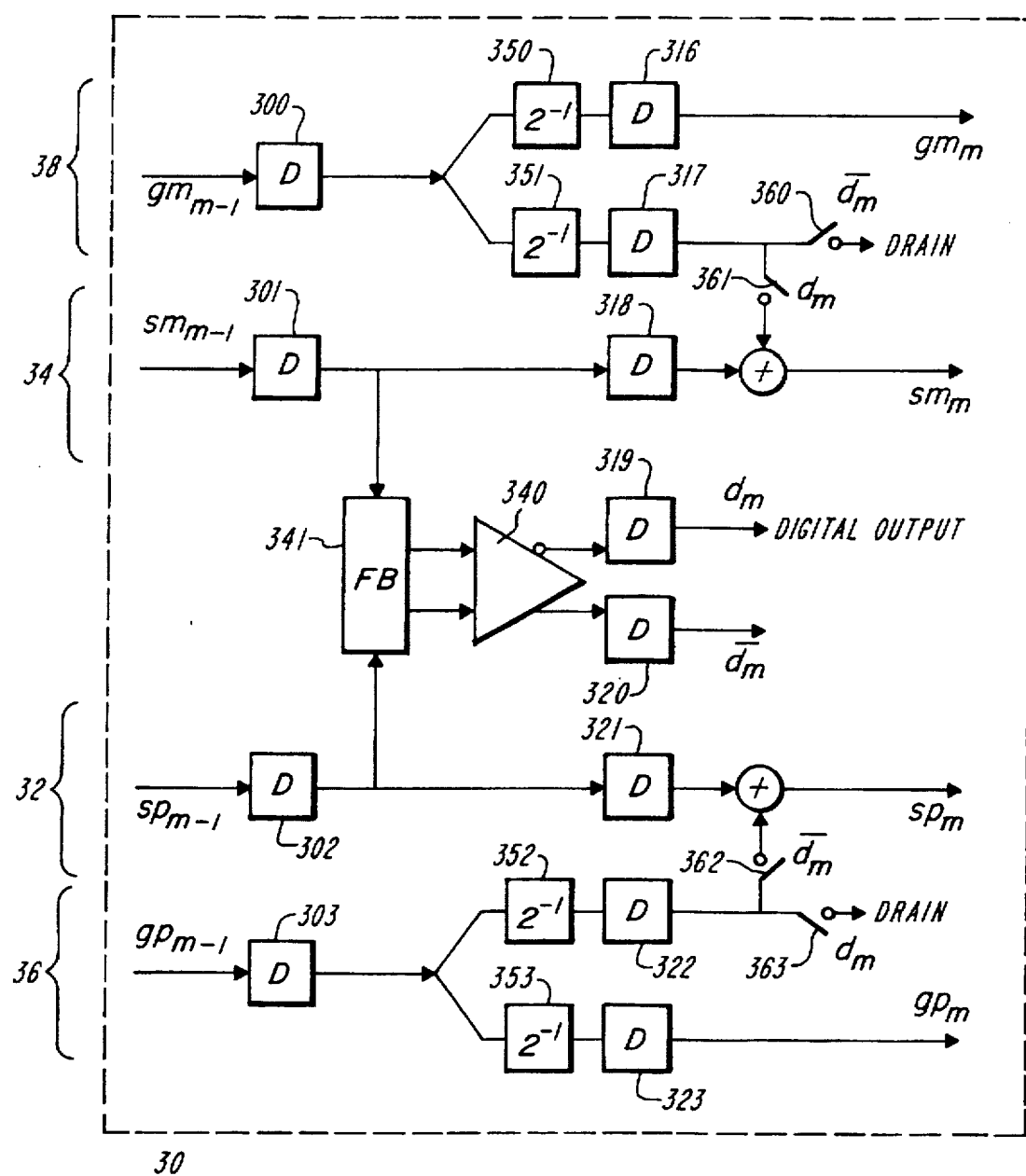
FIG. 3A shows a block diagram representation of a single conversion unit for a second exemplary embodiment of the present invention utilizing dual scaling channels.
Figure 4:
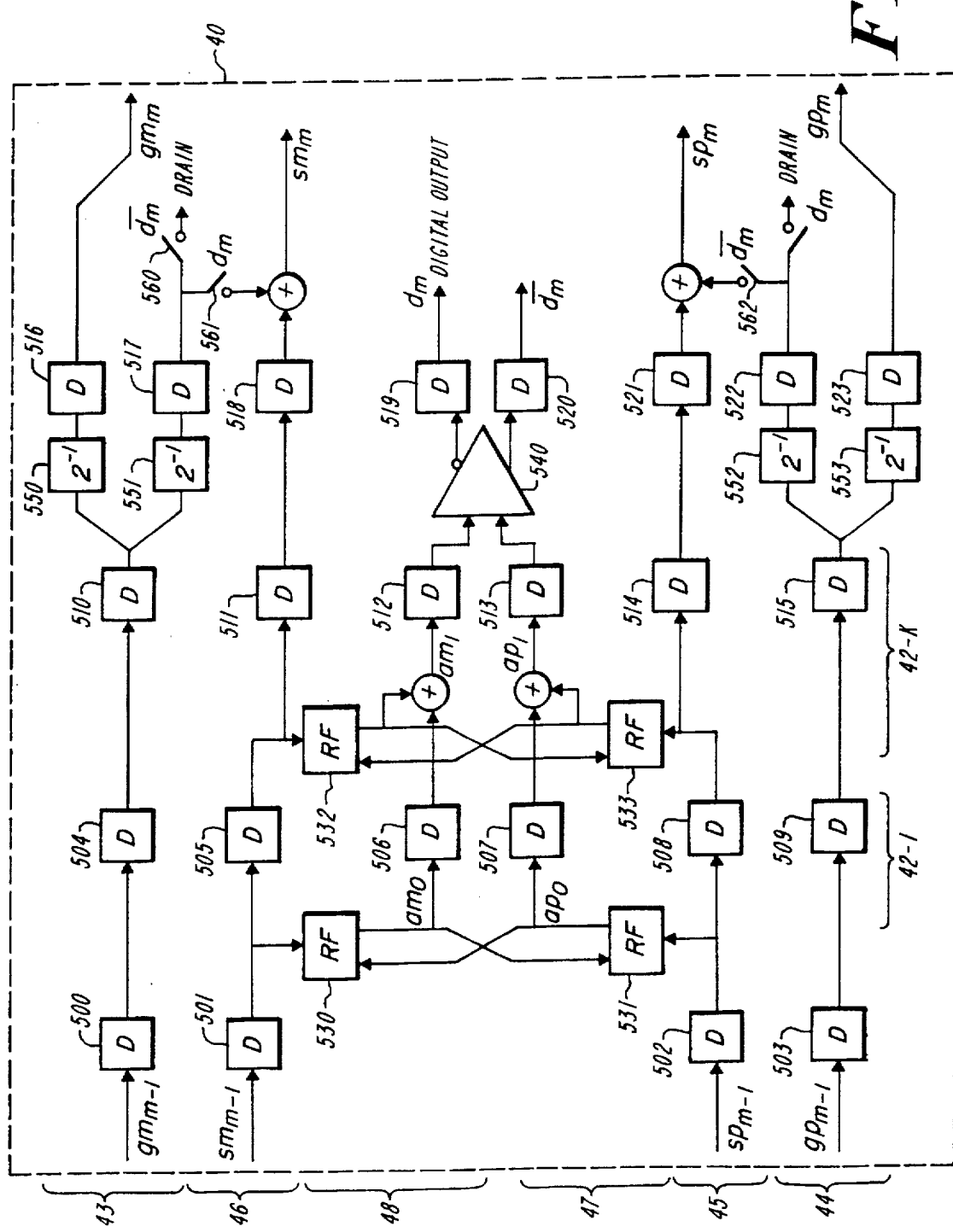
FIG. 4 shows a block diagram representation of a single conversion unit for a third exemplary embodiment of the present invention utilizing distributed sensing, dual scaling channels, and charge-domain amplification in accordance with the present invention.

With reference now to FIG. 3A, a block diagram representation of a single conversion unit 30 for a second exemplary embodiment utilizing dual scaling channels in accordance with the present invention is shown. Positive 36 and negative 38 scaling channels are used to generate modification charges for associated positive and negative signal charges, respectively. Scaling charge inputs, $gp_{m-1}$ and $gm_{m-1}$, enter from a preceding unit and are each split in half to form positive and negative modification charges 352 and 351, respectively, and scaling outputs 353 and 350, respectively. Charges in the signal channels are non-destructively sensed by structure 341 which incorporates feedback to suppress their common-mode component and generate a differential input to the comparator 340. Outputs of the comparator, dm and /dm, are then used to direct one of the positive and negative modification charges to its corresponding signal channel and to remove the other to a drain. Either of the comparator outputs may be used to form the digital result.

The conversion unit 30 is intended for applications with a medium size LSB and large dynamic range requirements. In these cases, large geometry CCD gates are used and because the charge-to-voltage gain of floating gate amplifiers is inversely proportional to their capacitance, the sensitivity will be low. Thus, the voltage generated from an LSB when sensed by floating gate devices is less than the resolution of the comparators or the input-offset error of a voltage amplifier. The charge signals must be sensed on a capacitance which is significantly smaller than that of the gates in the differential signal channel. They may not be independently sensed because each channel's common-mode component will saturate this smaller capacitance. If the two sensing paths are coupled with negative feedback, the common-mode signal may be suppressed.

If a single scaling channel, such as that for the embodiment illustrated in FIG. 2, is located between the positive and negative channels, then any signals required to couple the sensing elements from these channels will have a relatively large capacitance and must be buffered. This also prohibits the cross-coupling of any floating nodes. The architecture illustrated in FIG. 3 eliminates this restriction by including duplicate scaling channels and placing each of these outside the positive and negative channels. Accordingly, the sensing and comparison structures may be located adjacent to one another in the center of the structure.

During the first phase of operation, the charges $gm_{m-1}$, and $gp_{m-1}$ corresponding to the scaling outputs from the previous unit, are advanced to delay elements 300 and 303, and are each split into two equal modification packets by charge splitting gates 350–353. The charges $sm_{m-1}$ and $sp_{m-1}$ from the previous conversion unit are advanced to delay elements 301 and 302. Charge-mode sensing element 341 replicates the positive and negative signal charges while at the same time blocking most of the common mode charge. The outputs therefrom are fed to a comparator 340 which decides whether the positive or negative channel had more charge, and thereafter produces two digital signals, $d_m$ and $/d_m$, indicative of the result.

In the second phase of operation, the outputs of comparator 340 are latched by delay elements 319 and 320, and are driven to conditional transfer gates 360–363. If more charge was present in the negative channel, $/d_m$ will be asserted and the conditional transfer gates 360 and 362 will be activated. This operation will cause the modification charge from delay element 322 to be added to the positive signal charge from delay element 321 and the modification charge from delay element 317 to be removed by the charge drain. If, instead, $d_m$ is asserted, the conditional transfer gates 361 and 363 will be activated. This will cause the modification charge from delay element 317 to be added to the negative signal charge from delay element 318 and the modification charge from delay element 322 to be removed by the charge drain. The newly summed quantities in the negative and positive channels are passed forward to become the outputs from the current unit. Modification charges from charge splitting gates 350 and 353 are passed forward to delay elements 316 and 323, and become the scaling channel outputs from the current conversion unit. The digital bit $d_m$, which was latched by delay element 319, is driven to external circuitry where it is used to form the resulting output word.

The charge-mode sensing of element 341 is accomplished by sensing each of the charges and by feeding back and subtracting from these signals a quantity proportional to their average. One preferred method of performing this is through charge replication with common-mode feedback which is described hereinafter.

Figure 3B:
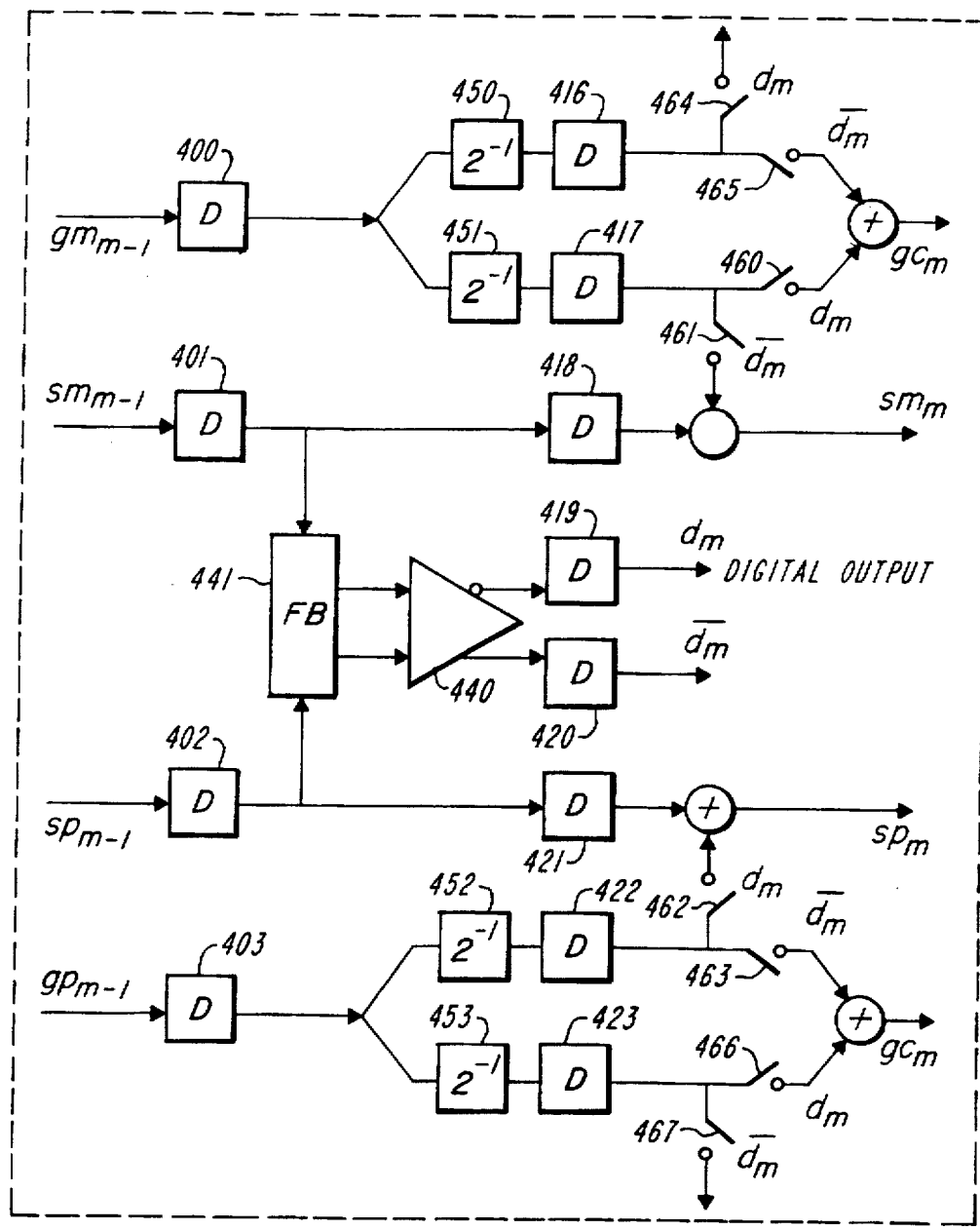
FIG. 3B shows an implementation of the second embodiment which includes an alternative means for generating and transferring modification charge packets.

An alternative implementation of the second embodiment, shown in FIG. 3B, differs from that of FIG. 3A in the means for generating and transferring modification charge packets. Positive and negative scaling signals are admitted from a preceding unit and are each split in half to generate associated positive and negative modification charges 452, 453 and 451, 450 respectively. One state of the comparator output, with dm asserted, will divert modification charge 452 to the positive signal channel, 453 to the positive scaling channel output, 451 to the negative scaling output, and 450 to a charge drain. The other state of the comparator, with /dm asserted will divert modification charge 452 to the positive scaling channel output, 453 to a charge drain, 451 to the negative signal channel, and 450 to the negative scaling channel output.

With reference now to FIG. 4, a block diagram representation of a single conversion unit 40 for a third exemplary embodiment of the present invention is shown. For purposes of illustration this device includes a 2-stage distributed sensing pipeline labeled as 42-1 through 42-K and dual scaling channels labeled as 43 and 44, all in accordance with the present invention. Charges in the positive 45 and negative 46 signal channels are repeatedly, nondestructively sensed in successive stages by replicators 531, 533 and 530, 532 respectively. Each of these stages incorporates feedback between the positive and negative signals for providing differential amplification and common-mode rejection of the positive and negative signal charges. The replicator outputs are accumulated in a positive accumulator channel 47 associated with the positive signal channel and a negative accumulator channel 48 associated with the negative signal channel. The accumulator charges are passed forward in parallel with the signals being sensed so that after multiple stages they will form an amplified, non-linear representation of the differential signal charges. Charges in the positive and negative scaling channels are accepted from a preceding unit and are split in half to form associated positive and negative modification charges 522 and 517, respectively and scaling outputs 523 and 516, respectively. Outputs of the comparator, dm and /dm, are used to direct one of the positive and negative modification charges to its corresponding signal channel and to dump the other. Either of the comparator outputs may be used to form the digital result.

The unit 40 is intended for applications with a small LSB and large dynamic range requirements. Such cases combine the difficulties of both previously described embodiments. The charge signals must be non-destructively replicated and amplified before they are converted to a voltage. However, the replication path must include feedback to suppress the common-mode.

During the first phase of operation, signals $s_{m-1}$ and $sp_{m-1}$ are advanced to delay elements 501 and 502, and then fed to charge replicator with feedback units 530 and 531. The output of the negative replicator 530 is fed back to the positive replicator 531 and vice versa to provide the outputs $am_0$ and $ap_0$ with both differential amplification and common-mode suppression. Signals $gm_{m-1}$ and $gp_{m-1}$ are advanced to delay elements 500 and 503.

In the second phase of operation, signals $am_0$ and $ap_0$ are advanced to delay elements 506 and 507, and then fed to charge replicator with feedback units 532 and 533. The output from the negative replicator 533 is fed back to the positive replicator 532 and vice versa to provide differential amplification and common-mode suppression. The outputs of replicators 532 and 533 are then summed with the charges from delay elements 506 and 507 to produce signals $am_1$ and $ap_1$. Charges in the negative and positive scaling channels are advanced to delay elements 504 and 509.

During the third phase of operation, charges in the negative and positive scaling channels are advanced to delay elements 510 and 515, and are each divided into two equal packets by charge splitting gates 550-553. Charges in the positive and negative signal channels are advanced to delay elements 511 and 514, respectively. Charges in the negative and positive accumulator channels are advanced to delay elements 512 and 513, and are destructively sensed and fed to the inputs of a comparator 540. The comparator determines which of the accumulators had more charge and generates two complimentary bits corresponding to the result.

In the fourth phase of operation, the comparator outputs, $d_m$ and $/d_m$, are latched in delay elements 519 and 520 and are driven to the conditional transfer gates 560–563. If more charge was present in the negative channel, $/d_m$ will be asserted and the conditional transfer gates 560 and 562 will be activated. This operation will cause the modification charge from delay element 522 to be added to the positive signal charge from delay element 521, and the modification charge from delay element 517 to be removed by the charge drain. If, instead, $d_m$ is asserted, the conditional transfer gates 561 and 563 will be activated. This will cause the modification charge from delay element 517 to be added to the negative signal charge from delay element 518 and the modification charge from delay element 522 to be removed by the charge drain. Charges in delay elements 516 and 523 are passed forward to become the scaling channel outputs from the current conversion unit. The digital bit $d_m$ is driven to external circuity where it is used to form the resulting output word.

FIG. 5A shows a block diagram representation of an exemplary embodiment of the present invention which incorporates digital error correction. In a converter without error correction, the subranging decisions at each stage are made by the comparators, and once a subrange has been chosen, it is not possible to reverse the decision. In a typical device, the errors associated with incorrect comparisons result in non-contiguous subranges and effect conversion of those signals which lie close to subrange boundaries. Physically, an incorrect comparator decision will cause the modification charge to be added to the larger channel rather than the smaller. The unit's differential output will be greater than its scaling output and the differential can not be restored to zero in later stages.

The error introduced by an incorrect comparison is a known quantity and may be corrected for in later stages provided that sufficient charge is available in the scaling channel to restore zero differential. This may be accomplished by increasing the scaling signal in one or more conversion units by a known quantity. The scaling channel input to a series of units determines their full-scale conversion range. Increasing this quantity increases the subrange size and causes adjacent subranges to overlap. The digital bits produced by the later stages must be appropriately scaled to account for the change in converter gain and added to the bits from earlier stages to produce the converter's result.

Blocks 900, 902 represent typical conversion units with negative, positive and scaling channels 910,911, and 912. The initial series of conversion units 900 is followed by an interface stage 901 which serves to alter the scaling signal charge before passing it forward. This is followed by a final series of conversion units 902. Delay units 920, 921 serve to appropriately delay the results from each stage so that the output bits corresponding to a given input appear simultaneously.

An exemplary interface stage is shown in FIG. 5B. The quantity of charge $g_m$ is doubled before being passed forward. This is achieved by adding a quantity of charge 940, from an independent source, equal to $g_m$ to the scaling channel.

The final digital result for a converter utilizing the interface stage shown in FIG. 5B is produced by multiplier adder 930 using an error correction algorithm shown in FIG. 5C. Doubling the scaling input to the later units will decrease the gain of those units by a factor of two. To compensate for this, the output bits 923 from those stages following the interface are multiplied by a factor of two before being added to the output bits 922 from the initial N1 stages. This multiplication is indicated in the figure by a simple shifting of those bits by one position. The resulting digital word 924 contains N2−1 bits.

Figure 5D:
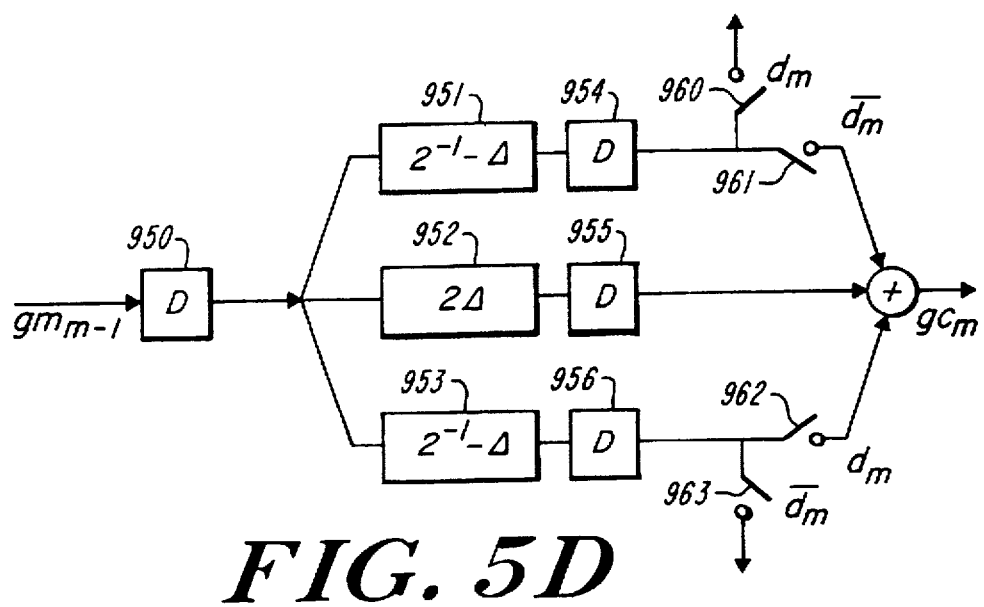
FIG. 5D shows a modified scaling channel.

Instead of adding charge from an independent source, the output $g'_m$ might be generated directly from the converter's full scale input. In this case, a separate interface stage would not be needed and instead the scaling channel in the previously described conversion units would be modified as shown in FIG. 5D. The purpose of this structure is to generate a modification charge which is less than half the scaling input $g_{m-1}$ and to generate a scaling channel output which is equal to more than half the scaling input. This is accomplished by dividing the scaling channel into two equal quantities and a third smaller quantity. One of the two equal charges from delay elements 954 and 956 will be utilized as the modification charge. The other will be passed forward and added to the charge from delay element 955 to become the scaling channel output.

The digital comparator outputs for a converter utilizing the structure shown in FIG. 5D cannot be used directly to construct the digital result. The bits from each pipeline stage must be scaled by the size of the modification charge in that stage and these weighting factors will decrease by a ratio of less than 2 in each successive stage. The converter's result is computed by adding the weighted digital bits for all stages.

Figure 6A:
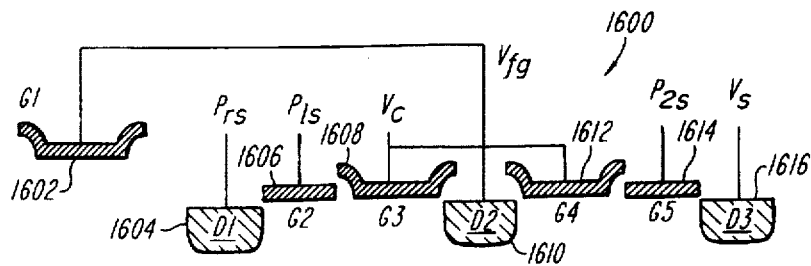
FIG. 6A shows an exemplary cascode charge sensing circuit in accordance with the present invention.

FIG. 6A an exemplary cascode sensing circuit 1600 constructed with a four transistor circuit configuration, which is used to perform nondestructive charge sensing in accordance with the present invention. The circuit 1600 consists of a floating gate electrode 1602 that is connected to an input diffusion 1610. The input diffusion is coupled, through series transistors, to a precharge diffusion 1604, and an output sensing diffusion 1616. Two cascode gates, 1608 and 1612, each with a constant bias voltage, Vc, are positioned on either side of the input diffusion 1610. The channel regions underneath these gates are referred to as cascode barriers. A first control gate 1606 is located between the input diffusion and the precharge diffusion. A second control gate 1614 is located between the input diffusion and the output diffusion.

Figure 6B:
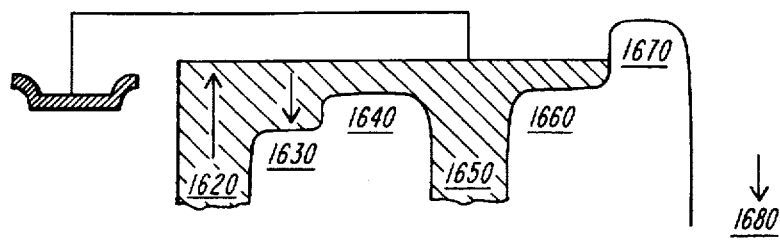
FIGS. 6B–6D show associated energy state diagrams.

The operation of cascode sensing is described with reference to the energy level diagrams shown in FIGS. 6B–6D. The precharge phase, shown in FIG. 6B, begins when the potential 1630 on the first control gate 1606 falls, the potential 1670 on the second control gate 1614 rises, the potential 1620 on the precharge diffusion 1604 falls, thereby closing the sensing path and opening the precharge path. During this fill process, charge from the precharge diffusion floods the region underneath gates 1606 and 1608 and precharges the input diffusion, which is connected to the floating gate, to a low potential. At the same time, the output diffusion 1616 is precharged high by conventional biasing means, such as an MOS switch, not shown in the figure.

Figure 6C:
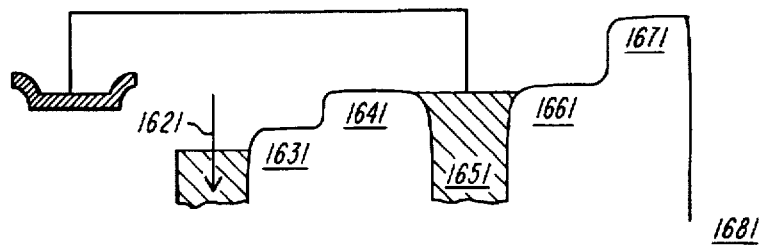

The spill process, shown in FIG. 6C, begins when the potential 1621 on the precharge diffusion rises, thereby, draining charge from the regions 1631, 1641 underneath gates 1606 and 1608. Current flow through these devices causes charge 1651 contained on the input diffusion 1610 to be gradually removed until device 1608 is cutoff and the input diffusion potential is equilibrated with the cascode barrier potential 1641, 1661. The final voltage on the floating gate after this sequence of precharge operations is one threshold drop below the dc bias voltage, Vc.

Before the sensing operation, the precharge to the output diffusion 1616 is released and the node is left floating and ready to accept charge. The sensing process, shown in FIG. 6D, begins when the potential 1622 on the first control gate 1606 falls and the potential 1672 on the second control gate 1614 rises, thereby closing the precharge path and opening the sensing path. Any charge that is shifted underneath the floating gate after this time causes a displacement charge to appear on the floating gate node and on the input diffusion 1610 and the potential 1652 on this node falls temporarily. Device 1612 is driven out of cutoff, and charge flows over the second cascode barrier 1662 and onto the output node 1682.

Figure 7:
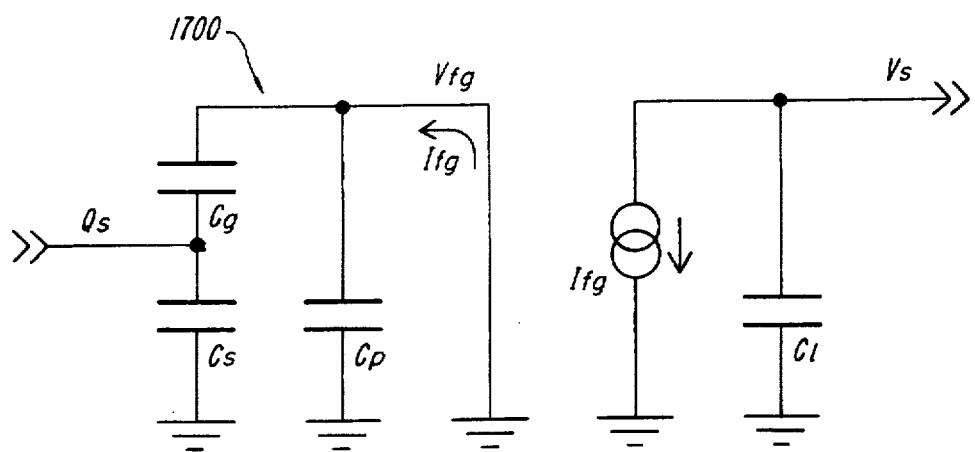
FIG. 7 shows an equivalent circuit for the cascode charge sensing circuit of FIG. 6A.

The characteristics of a cascode sense amplifier are analyzed in terms of the equivalent circuit 1700 shown in FIG. 7. Capacitances from the CCD channel to the overlying gate and the underlying substrate are denoted by Cg and Cs, respectively. Capacitance Cp represents junction and routing parasitics on the floating gate node and Cl models the output load, including parasitics, on which the signal is sensed. Because node Vfg is effectively clamped to a threshold below the dc bias potential Vc, the displacement current, Ifg, does not alter its potential and the node functions as a virtual ground. The displacement current is entirely reflected on the output node and can be modeled as a current dependent current source discharging the load capacitance Cl.

The injected signal charge, Qs, induces currents to both the substrate and the floating gate. The portion of this current that enters the floating gate is integrated over the sensing period and produces a final potential variation on the output given by $$V_s = \frac{Q_s}{C_l} \frac{C_g}{(C_s + C_g)}$$

Under the approximation that Cs is much less than Cg, the output voltage depends only on the input charge and the load capacitance, but does not depend on any actual or parasitic capacitances on the floating gate node.

There are a number of advantages of the cascode sensing technique over conventional floating gate techniques. The floating gate bias and the output signal are decoupled from each other. Although the voltage of the floating gate varies during the sensing process, it is eventually restored to its original value. Consequently, no net charge is expended to change the potential on this node and the transfer characteristic for a cascode sense amplifier does not depend on parasitic capacitances on the floating gate node.

Since the floating gate potential at the beginning and end of the sensing operation are identical, storage capacity of the CCD well is not compromised by an output voltage swing. Initially when charge is sensed, the gate potential falls, storage capacity is decreased, and some charge may reside underneath the well's preceding barrier. As the gate potential and associated storage capacity are restored by the sensing process, these charges will return and be confined once again to the floating gate well.

Since the output diffusion's potential is decoupled from the floating gate's potential by the second cascode gate, the floating gate's potential may be chosen to be compatible with clocking requirements imposed by adjacent CCD gates, while at the same time, the output diffusion's potential may be selected to be better matched to its receiving circuits.

The cascode sensing technique is essentially an autozeroed process because the precharge and the signal sensing are both performed with respect to the cascode barriers, which are biased at potential Vc. The accuracy depends on matching between these two gates, but does not depend critically on their absolute thresholds or characteristics. In an alternative configuration, gates 13 and 15 may be combined into a single gate with two output paths. In this case, even device matching is not critical.

Charge is transferred to the region underneath the floating gate from a CCD register that is directed perpendicularly to the plane of the paper. The cascode sensing technique results in a clocked floating gate waveform with voltage levels and timing that make it ideal for incorporation into CCD shift registers. During the precharge phase, when charge must be transferred forward, the floating gate is preset low. Before the sensing phase, when charge must be received, the floating gate is preset high. As a result, the cascode sensing configuration is operational with significantly lower clock swings than are required for a floating gate amplifier.

Figure 8A:
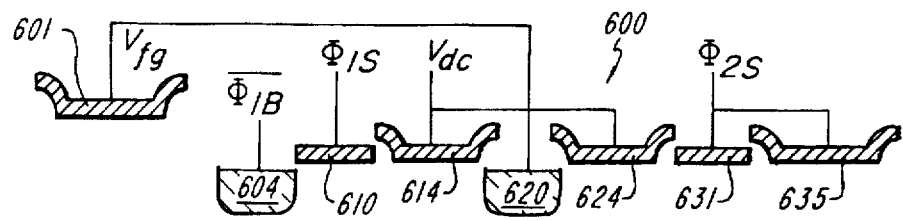
FIG. 8A shows an exemplary charge replicator circuit in accordance with the present invention.
Figure 8B:
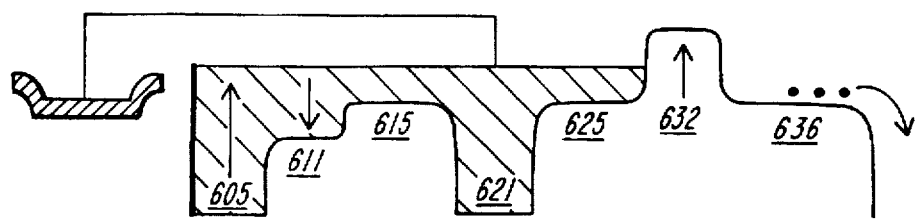
FIGS. 8B–8D show associated energy state diagrams.
Figure 8C:
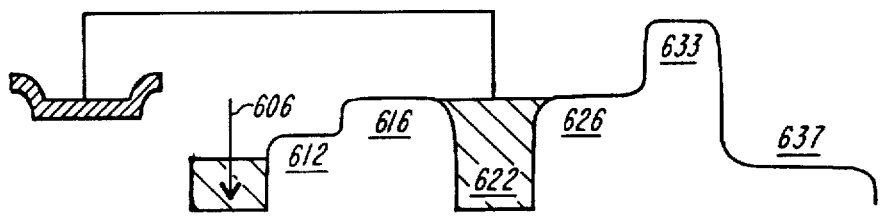
Figure 8D:
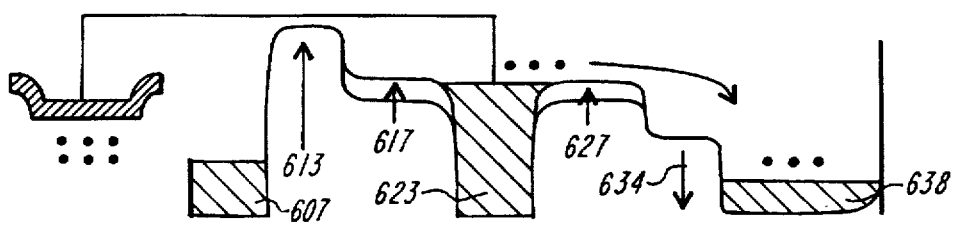

The present invention may also be used to accomplish charge-domain replication, which nondestructively senses charge signals and replicates them in a separate output well. In contrast to prior art methods of charge replication, signals in the present invention are never interpreted as voltages. The process of charge replication is described in more detail with reference to FIG. 8A which shows an exemplary charge cascode replicator circuit 600, and FIGS. 8B–8D showing associated energy state diagrams.

Structurally, the replicator circuit 600 is predominantly similar to the cascode sensing circuit 1600 of FIG. 6A, except that the output diffusion is replaced by a CCD storage well underneath gate 635. A floating gate 601 is initially preset, by a fill-and-spill process, to a level determined by the height of the barrier 615 created by the dc gate 614. The precharge phase, shown in FIG. 6B, begins when the potential on gate 631 falls, the potential on gate 610 rises, and the potential on diffusion 604 falls, thereby closing the sensing path and opening the precharge path. During this 'fill' process, charge from diffusion 605 floods the region underneath gates 611, 615, and 625 and the diffusion 621 which is connected to floating gate 600 is precharged to a low potential. The 'spill' process, shown in FIG. 4C, occurs when the potential on diffusion 606 rises. This causes all channel charge underneath gates 612, 616, and 626 to return to diffusion 606, and the resulting potential on diffusion 622 and floating gate 600 is left equal to the channel potential 616.

Figure 6D:
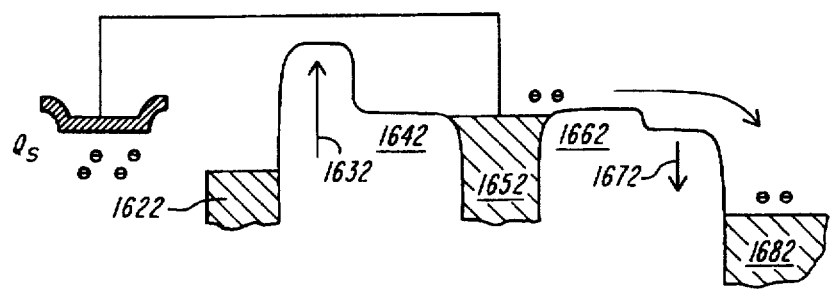

The sensing process, shown in FIG. 6D, begins when the potential on gate 613 falls and that on gate 634 rises, thereby closing the precharge path and opening the sensing path. Any charge which is shifted underneath floating gate 600 after this time will cause an approximately equal displacement charge to appear on the node consisting of gate 600 and diffusion 623. The potential on this node will temporarily fall and charge will flow over barrier 627 and be accumulated in receiving well 638. This method of charge replication is an autozeroed process because the precharge is performed with respect to the same barriers, 624 and 625, over which the signal will be sensed during the sensing phase. As a result, operation does not depend critically on any threshold voltages and even matching between different replicators is not required.

Although the potential on the floating gate 600 will vary during the sensing process, it will eventually be restored to its original value. The quantity of charge in the receiving well will depend only on the displacement charge introduced on the gate during the sensing phase. It will be independent of either the CCD capacitance of or the additional parasitics on the floating gate node.

The charge replicator circuit 600 can be analyzed using the equivalent circuit for a cascode sense amplifier previously shown in FIG. 7. In the case of a replicator, the output capacitance, Cl, is used to model the parallel combination of capacitances from the receiving well's channel to its overlying gate and underlying substrate. The dependent current source causes displacement current that is introduced onto the floating gate to be entirely reflected at the output. In a charge replicator, the most appropriate unit for measuring output signals is charge. Expressed in this way, the replicated charge packet is equal to $$Q_r = Q_s \frac{C_g}{(C_s + C_g)}$$

When Cs is much less than Cg, as is common for surface channel CCDs, the input and output charge packets are approximately equal. For buried channel CCDs, when this approximation is not as accurate, the input and output packets are proportional with a gain of slightly less than unity. Because of the similarity between the charge replicator of FIG. 6A and the cascode sensing circuit of FIG. 8A, most of the advantages listed above for cascode sensing also apply to charge replication. These include independence of the output signal on the floating gate capacitance, improved storage capacity, insensitivity to component characteristics, and operability with lower clock swings.

The described charge replicator has additional advantages since the signal flow occurs entirely in the charge domain. The resulting charge packet is independent of capacitances on the receiving node as well as on the floating gate node. The input and output charges are directly related without the need for any precharging or references to establish a zero level at the output. Operation is not sensitive to bias voltages on either the floating gate or on the cascode gates and a wide range of bias conditions is acceptable.

The process of charge replication with feedback is described in more detail with reference to FIGS. 9A–9D which shows an exemplary structure 700 and associated energy state diagrams. The structure is similar to that previously described for the charge replicator of FIG. 8A. However, the node containing gates 614 and 624, which was assumed to be at a fixed potential, is replaced by the node containing gates 714, 724, and 735, whose potential will vary.

A floating gate 701 is initially preset, by a fill-and-spill process, to a level determined by the height of the barrier 715 created by the gate 714. This process is similar to that described above in reference to FIG. 8. During the precharge phase, node $V_{fb}$ is also precharged by means, not shown in the figure, such as a reset transistor or by a separate but similar fill-and spill technique.

Figure 9A:
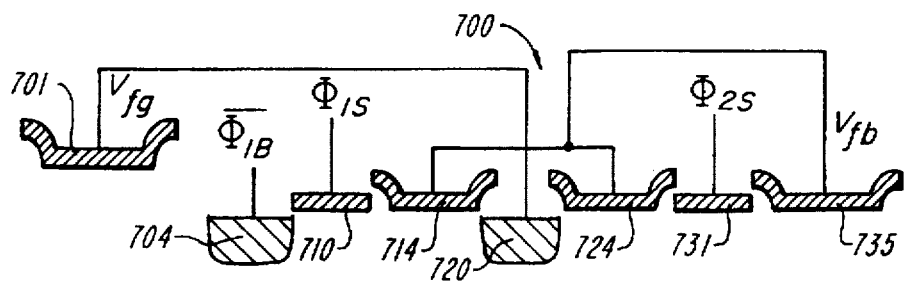
FIGS. 9A–9D respectively show an exemplary structure and associated energy state diagrams illustrating the process of charge replication with feedback.
Figure 9B:
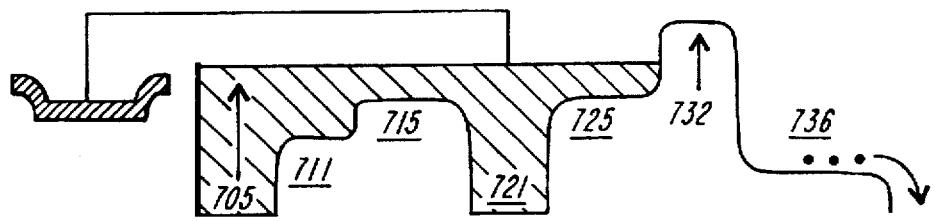
Figure 9C:
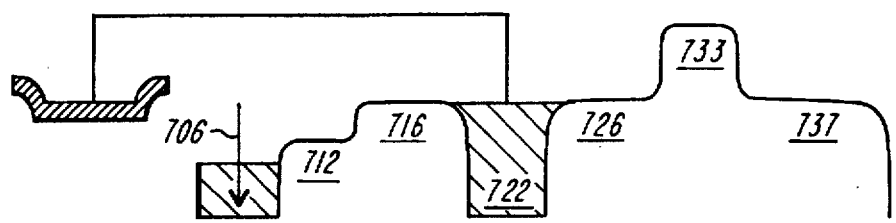
Figure 9D:
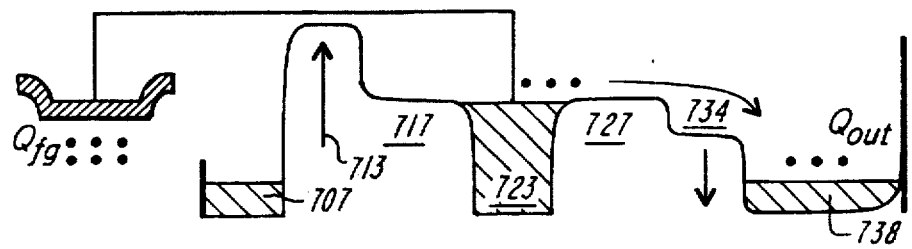

The sensing process, shown in FIG. 9D, begins when the potential on gate 713 falls and that on gate 734 rises, thereby closing the precharge path and opening the sensing path. The precharge on node $V_{fb}$ is released and the node is left floating. Any charge which is shifted underneath floating gate 700 after this time will cause an approximately equal displacement charge to appear on the node consisting of gate 700 and diffusion 723. The potential on this node will temporarily fall and charge will flow over barrier 727 and be accumulated in receiving well 738. This accumulated charge will cause the potential on node $V_{fg}$ to fall and the height of the barriers 717 and 727 to rise. Some of the displacement charge will remain on diffusion 723 and the potential on this node will fall by an amount equal to the change in barrier heights 717 and 727. The output charge will be equal to the input displacement charge minus the portion of this charge which was required to change the potential on $V_{fg}$.

The described configuration requires that the channel potential in the receiving well be more positive than that of the replication barrier, even though the two gates are at the same potential. This can be achieved by any one of a number of techniques such as an offset implant or by making the well a buried channel and the barrier a surface channel. The primary advantage of the structure of FIG. 9A occurs when two such replicators are utilized as a differential pair. If the node $V_{fg}$ is driven to contain a measure of the common-mode signal component between the two, then common-mode rejection can be achieved. If the nodes $V_{fg}$ are driven to contain a measure of the opposite polarity signal, then differential amplification can be achieved.

Figure 10A:
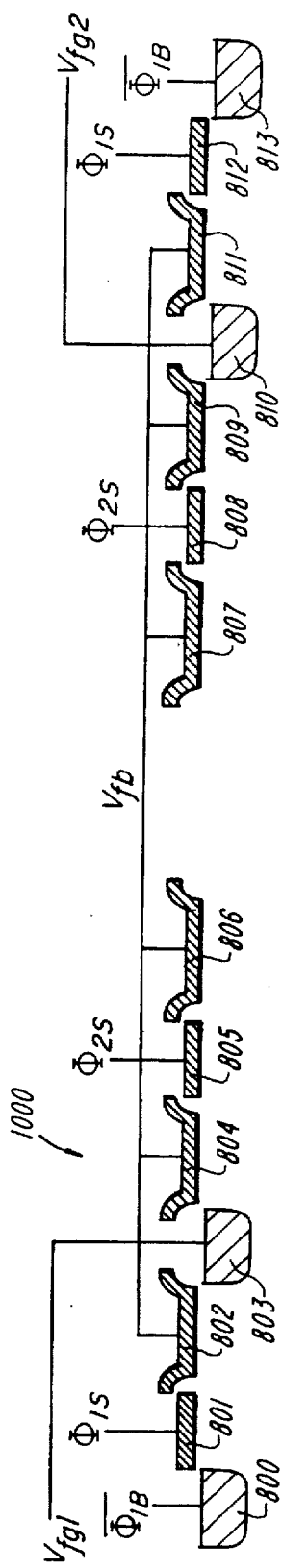
FIG. 10A shows an exemplary structure for achieving common-mode feedback.

An exemplary structure 1000 for achieving common-mode feedback is shown in FIG. 10A. In this configuration, the floating node $V_{fg}$ is common to both replicators. Common-mode rejection is achieved because the sum of the output charges underneath gates 806 and 807 will cause the node $V_{fg}$ to fall and cause a corresponding increase in the heights of barriers under gates 804 and 809. The resulting output charges will have a common component, proportional to the average of the two signals, subtracted from them.

Figure 10B:
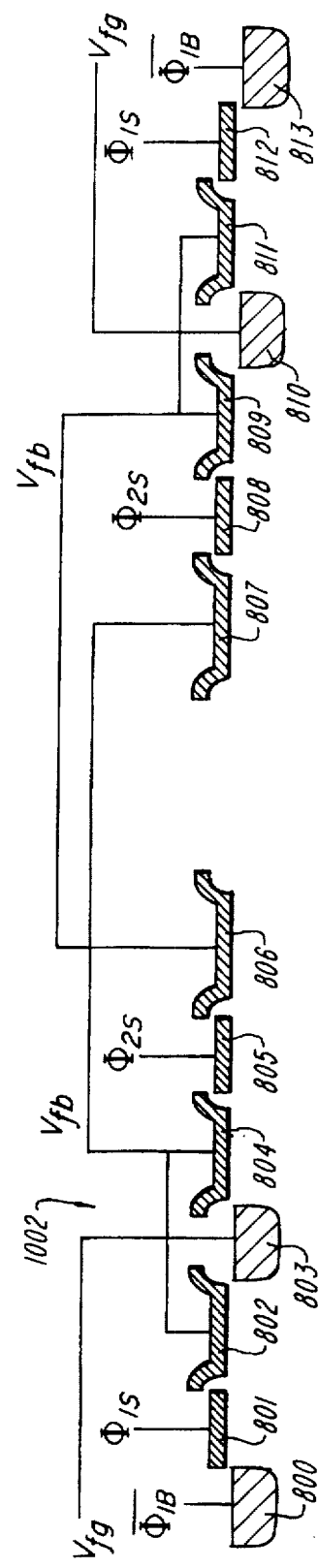
FIG. 10B shows an exemplary structure for achieving differential mode amplification.

An exemplary structure 1002 for achieving differential mode amplification is shown in FIG. 10B. In this configuration, the output well of the negative side is sensed and used to gate the flow of charge into the positive well and vice versa. The more charge which appears on one side's output, the more charge which will the blocked from entering the opposite side's output.

Figure 11A:
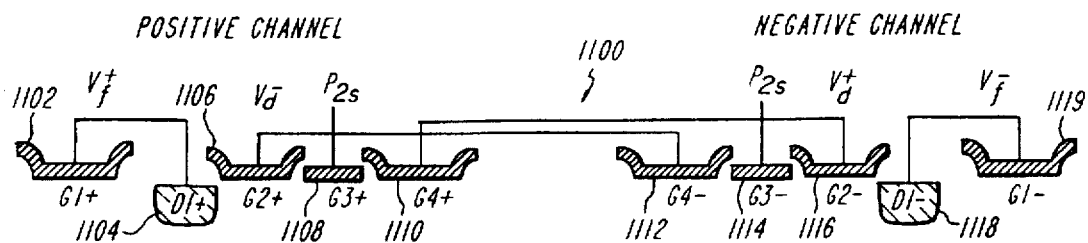
FIG. 11A shows a differential cascode charge replication circuit in accordance with the present invention.

Another embodiment of the present invention, referred to as differential cascode replication, is capable of implementing both differential amplification and common-mode suppression in the charge domain as part of the replication process. FIG. 11A shows the structure of such a replicator circuit 1100. Two CCD channels, referred to as the positive and negative channels, flow perpendicularly to the plane of the page and underneath floating gates 1102 and 1119. Each floating gate is connected to a slightly modified charge replicator. The positive and negative replicators are combined in a feedback configuration by connecting gates 1110 and 1112, above each replicator's output well, to the cascode barrier in the opposite replicator. These gates are capacitively coupled to their underlying receiving wells and serve as blocking gates for charge flow into the opposite channel's receiving wells and serve as blocking gates for charge flow into the opposite channel's receiving well.

Figure 11B:
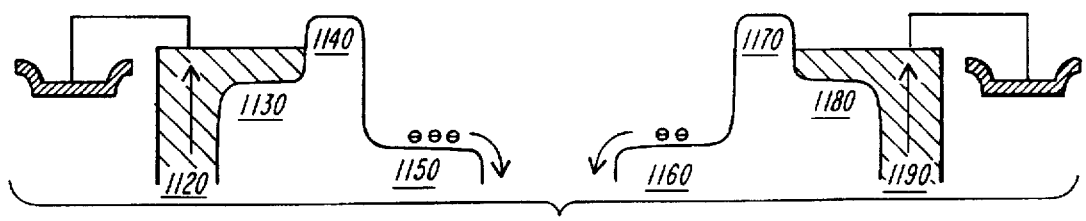
FIGS. 11B–11D show associated energy state diagrams.
Figure 11C:
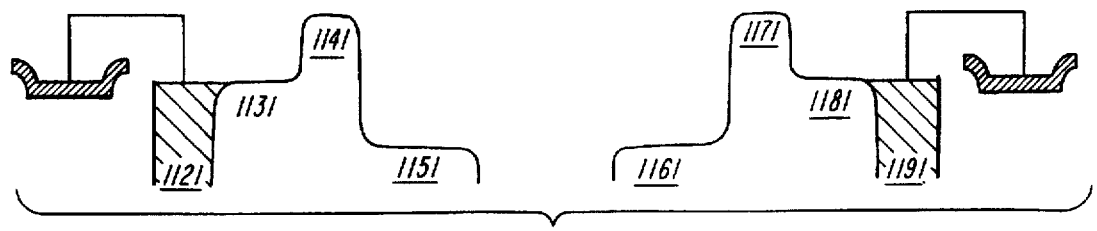
Figure 11D:
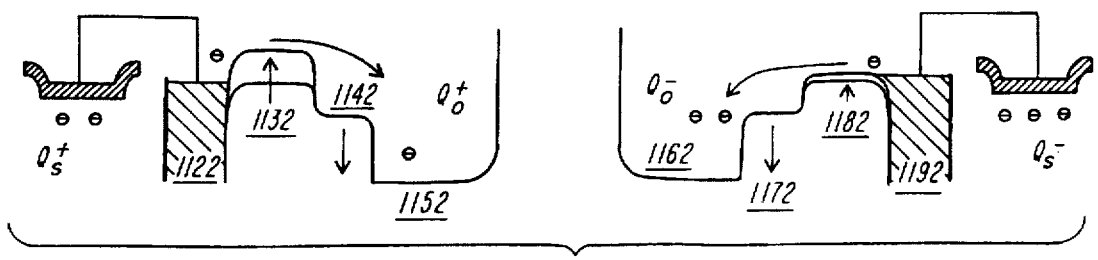

The associated energy state diagrams are shown in FIGS. 11B–11D. During the precharge phase, shown in FIGS. 11B and 11C, the floating gates are initially preset, in the manner described earlier for a charge replicator, to a level determined by the potential 1130, 1180 on the cascode gates 1106 and 1116. At the same time, the gates 1110 and 1112 are precharged to a fixed bias voltage by means such as a MOS reset transistor or a second similar cascode technique.

The sensing process, shown in FIG. 11D, begins when the potential 1142, 1172 on the control gates 1108 and 1114 rises. Any charge that is shifted underneath the floating gates after this time is reflected on the input diffusions 1104 and 1118, and the potentials on these nodes fall temporarily. Current flows through the replicators and charge is accumulated in the receiving wells until the potentials on each of the input diffusions are once again equilibrated with the potentials underneath their adjacent cascode barriers.

As a result of the described feedback configuration, the output charges depend primarily on the difference between the positive and negative inputs. Because gates 1110 and 1112 are dynamic, they serve to sense the charge in their underlying wells and their potential varies in proportion to the opposite channel's accumulated output. Accumulated charge causes their potential to decrease and the height of the associated cascode barriers to increase. Some of the charge on the input nodes 1104 and 1116 is blocked by an increase in these barriers and the potential on the floating gate nodes falls accordingly.

In this procedure, the output well of the negative channel is sensed and used to block the flow of charge into the positive well, and vice versa. When more charge appears on one side's output, more charge is blocked from entering the opposite side's receiving well. The average of the input signals appears as a common decrease in the potential of the floating gates and this quantity is fed back and subtracted from the outputs. At the same time, the difference between the input signals is amplified and stored in the receiving wells.

The cascode differential replication technique is well suited for performing charge packet comparisons. Its input-output transfer characteristic will be extremely nonlinear because of the presence of positive feedback in the sensing path. However, when the ultimate objective of a charge sensing operation is comparison, the absolute sensing characteristic is not critical and does not need to be linear. As long as it is monotonic, the sign of the accumulated difference is preserved and the comparator will generate the correct result.

The circuit 1100 requires that the channel potential in the receiving wells underneath gates 1110 and 1112 be more positive than that of the cascode barriers underneath gates 1106 and 1116, even though in the absence of differential, at the beginning of the sensing phase, these gates are at the same potential. This may be achieved by any barrier offsetting technique such as a barrier or storage implant. Alternatively, a buried channel receiving well and a surface channel cascode barrier may be used.

A charge replicator operates by integrating capacitive displacement current, which is introduced onto the floating gate, in a CCD receiving well. The source of displacement current is carriers that are introduced into the channel region underneath the floating gate. If, instead, this current is introduced as a voltage change across another form of capacitor, such as a polysilicon-to-polysilicon capacitor, then the structure functions in a similar manner as a voltage-to-charge converter.

Figure 12:
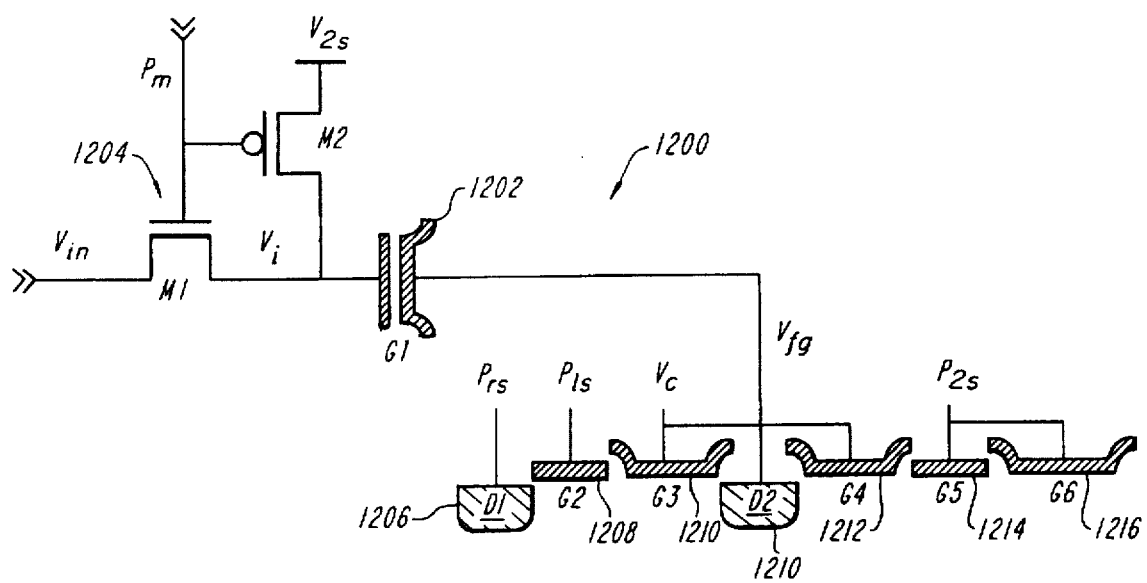
FIG. 12 shows a cascode charge input circuit in accordance with the present invention.

A cascode charge input circuit 1200 in accordance with the present invention is illustrated in FIG. 12. The circuit, referred to as a cascode charge generator, differs from a charge replicator in that its floating gate is replaced by a series capacitor 1202 and the input side of this capacitor is connected to a clamp-and-sample circuit 1204. When the sample clock, Pm, is low, the input side of the capacitor is precharged high to a level determined by bias $V_{2r}$. When the sample clock is high, the input side of the capacitor is discharged to the level of the input signal, $V_{in}$. This voltage change across the input capacitor constitutes the signal and produces a proportional displacement charge on the input diffusion 1210.

The remainder of a charge generation operation occurs in a manner identical to that previously described for charge replication. Displacement charge, introduced onto the input diffusion, flows over the cascode barrier 1212, and is accumulated in the receiving well, underneath gate 1216.

The characteristics of a cascode charge generator are analyzed with respect to the equivalent circuit 1700 shown in FIG. 7. Element Cg represents the series input capacitor, while Cl and Cp correspond to parasitic capacitances on nodes Vi and Vfg, respectively. Node Vi experiences a change in voltage of $V_{2r}-V_{in}$ between the clamp and sample operations and produces a current Ifg. Node Vfg acts as a virtual ground and, as a result, the entire input current is integrated in the output well as:

$$Q_s = C_g(V_{2r} - V_{in})$$

The primary advantage of a cascode charge generator is that it provides a significant improvement in linearity over other prior art techniques. The voltage-to-charge translation characteristic is proportional to the series input capacitor and does not depend critically on any other capacitances. Capacitors, such as polysilicon-to-polysilicon or metal-to-metal capacitors, offer excellent linearity and may be used in such a configuration to produce a generator with improved accuracy.

In a charge replicator, the sensed charge packet causes the injection of current both onto the floating gate and into the substrate. Consequently, the replicator receives slightly less than the full quantity of charge. The resulting replication gain is slightly less than unity and depends on parasitic capacitance between the CCD channel and the substrate. In contrast, in a cascode charge generator, parasitic capacitances on both the input and the output sides of the series capacitor do not impact the generated charge packet.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A charge generation device configured within a semiconductor region of a substrate, said device comprising:

a source for providing an input charge;

an input diffusion which receives said input charge;

a barrier gate associated with said input diffusion which determines a selected potential of said input diffusion;

a preset diffusion which presets said input diffusion to said selected potential;

an output element which receives said input charge from said input diffusion;

first coupling means for coupling said preset diffusion to said input diffusion subsequent to said output diffusion receiving said input charge during a first clock cycle, and for decoupling said preset diffusion from said input diffusion prior to said input diffusion receiving said input charge during a second clock cycle; and second coupling means for coupling said output element to said input diffusion, subsequent to said decoupling of said preset diffusion from said input diffusion during said second clock cycle, and for decoupling said output element from said input diffusion prior to said coupling of said preset diffusion to said input diffusion during a third clock cycle.

2. The device of claim 1, wherein said input diffusion is coupled to a source of displacement charge.

3. The device of claim 2, wherein said barrier gate comprises a fixed bias gate configured on either side of said input diffusion.

4. The device of claim 3, wherein said fixed bias gate defines underlying channel regions which serve as cascode barriers.

5. The device of claim 4, wherein said first coupling means comprises a gate configured between said precharge diffusion and said barrier gate.

6. The device of claim 5, wherein said second coupling means comprises a gate configured between said barrier gate and said output element.

7. The device of claim 6, wherein said output element comprises a storage well defined underneath an output gate.

8. The device of claim 7, wherein said source of displacement charge comprises a floating gate.

9. The device of claim 8, wherein said input charge received by said output element corresponds to a replicated charge packet corresponding to said displacement charge of said floating gate.

10. The device of claim 7, wherein said source of displacement charge comprises an input capacitor having an input terminal coupled to a voltage-mode signal and an output terminal coupled to said input diffusion.

11. The device of claim 10, wherein said input charge received by said output element corresponds to a generated charge packet associated with the displacement charge of said polysilicon capacitor.

12. A charge replication device configured within a semiconductor region of a substrate, said device comprising:

a floating gate;

an input diffusion coupled to said floating gate;

a cascode barrier gate including a first cascode gate arranged on one side of said input diffusion, and a second cascode gate arranged on the opposite side of said input diffusion;

a precharge diffusion;

a first control gate arranged between said precharge diffusion and said first cascode gate;

an output element; and a second control gate arranged between said output element and said second cascode gate.

13. The device of claim 12 further comprising a blocking gate arranged between said input diffusion and said output element, and operable for altering the transfer of charge from said input diffusion to said output element.

14. The device of claim 13, wherein said blocking gate is coupled to said output element.

15. The device of claim 13, wherein said blocking gate is coupled to an output element of a second independent charge replication device.

16. A charge generator device configured within a semiconductor region of a substrate, said device comprising:

a capacitor element having an input node coupled to a voltage source, and an output node;

an input diffusion coupled to said output node of said capacitor element;

a cascode barrier gate including a first gate arranged on one side of said input diffusion and a second gate arranged on the opposite side of said input diffusion;

a precharge diffusion;

an input gate arranged between said precharge diffusion and said first gate;

an output element; and an output gate arranged between said output element and said second gate.

17. A charge replicator device configured within a semiconductor region of a substrate, said device comprising:

a floating gate which senses charge packets to be replicated;

an input diffusion coupled to said floating gate, said input diffusion initially operable for setting said floating gate to a set potential and for receiving displacement charge corresponding to charge packets sensed by said floating gate;

a cascode barrier gate associated with said input diffusion which establishes said set potential;

a precharge diffusion which is initially set to a low potential to provide charge to said input diffusion and which is subsequently set to a high potential to remove charge from said input diffusion and precharge said input diffusion at said set potential;

a first control gate arranged between said precharge diffusion and said input diffusion, said first control gate operable for selectively allowing the flow of charge from said precharge diffusion to said input diffusion;

an output element which receives charge from said input diffusion corresponding to said displacement charge, the charge received at said output element representing a replication of the charge sensed by said floating gate; and a second control gate arranged between said output element and said input diffusion, said second control gate operable for selectively allowing the flow of charge from said input diffusion to said output element.

18. A charge generator device configured within a semiconductor region of a substrate, said device comprising:

a capacitor element which provides displacement charge to a floating node;

an input diffusion coupled to said capacitor element, said input diffusion initially operable for setting said floating node to a set potential and for receiving said displacement charge provided by said capacitor element;

a cascode barrier gate associated with said input diffusion which establishes said set potential;

a precharge diffusion which is initially set to a low potential to provide charge to said input diffusion and which is subsequently set to a high potential to remove charge from said input diffusion and precharge said input diffusion at said set potential;

a first control gate arranged between said precharge diffusion and said input diffusion, said first control gate operable for selectively allowing the flow of charge from said precharge diffusion to said input diffusion;

an output element which receives charge from said input diffusion corresponding to said displacement charge, the charge received at said output element representing a newly generated charge packet; and a second control gate arranged between said output element and said input diffusion, said second control gate operable for selectively allowing the flow of charge from said input diffusion to said output element.

* * * * *

UNITED STATES PATENT AND TRADEMARK OFFICE
CERTIFICATE OF CORRECTION

| | | |
|---|---|---|
| PATENT NO. | : 5,736,757 | Page 1 of 1 |
| APPLICATION NO. | : 08/580427 | |
| DATED | : April 7, 1998 | |
| INVENTOR(S) | : Paul | |

It is certified that error appears in the above-identified patent and that said Letters Patent is hereby corrected as shown below:

Column 1, line 7 should read as follows:

--This invention was made with government support under Grant No. F19628-90-C-0002, awarded by the US Air Force. The government has certain rights in this invention.--

Signed and Sealed this
Tenth Day of May, 2011

David J. Kappos
*Director of the United States Patent and Trademark Office*